United States Patent [19]

Jacobson et al.

[11] 3,807,039

[45] Apr. 30, 1974

[54] METHOD FOR MAKING A RADIO FREQUENCY TRANSISTOR STRUCTURE

[75] Inventors: David Stanley Jacobson, Flemington; Ronald Albert Duclos, Lebanon, both of N.J.

[73] Assignee: RCA Corporation, New York, N.Y.

[22] Filed: Aug. 28, 1972

[21] Appl. No.: 284,092

Related U.S. Application Data

[63] Continuation-in-part of Ser. No. 131,229, April 5, 1971, abandoned.

[52] U.S. Cl. ........................ 29/578, 29/590, 29/588, 148/187

[51] Int. Cl. ........................ B01j 17/00

[58] Field of Search ........................ 29/578, 590, 588

[56] References Cited

UNITED STATES PATENTS

| | | | |
|---|---|---|---|
| 3,545,076 | 12/1970 | Schulter | 29/578 |
| 3,567,506 | 3/1971 | Belardi | 29/578 |
| 3,398,335 | 8/1968 | Dill | 29/578 |
| 3,411,199 | 11/1968 | Heiman | 29/578 |

*Primary Examiner*—W. C. Tupman

[57] ABSTRACT

A transistor is made by first forming adjacent collector and base regions in a semiconductor body. A conductive grid comprising a high-temperature intermetallic compound of the semiconductor is then disposed on the base region at one surface of the body and surrounds each of a plurality of emitter sites. The body is then heated to cause diffusion of impurities in the emitter sites to form emitter segments of a desired depth. The emitters may be partially diffused prior to the formation of the conductive grid.

8 Claims, 9 Drawing Figures

INVENTORS.
Ronald A. Duclos and
David S. Jacobson
BY Herbert L. Allen
ATTORNEY

INVENTORS.
Ronald A. Duclos and
David S. Jacobson
BY Herbert L. Allen
ATTORNEY

INVENTORS.
Ronald A. Duclos and
David S. Jacobson
BY Herbert L. Allen
ATTORNEY

INVENTORS.
Ronald A. Duclos and
David S. Jacobson.
BY Herbert L. Allen
ATTORNEY

METHOD FOR MAKING A RADIO FREQUENCY TRANSISTOR STRUCTURE

RELATIONSHIP TO PREVIOUSLY FILED APPLICATION

This is a continuation-in-part of U.S. Pat. application, Ser. No. 131,229, of the present inventors, for Radio Frequency Transistor Structure and Method for Making, filed Apr. 5, 1971 and now abandoned. This application contains claims to an invention disclosed in the prior application but withdrawn from consideration there as drawn to a non-elected invention.

The invention was made in the course of a contract with the Department of the Air Force.

BACKGROUND OF THE INVENTION

The present invention relates to semiconductor devices, and in particular, relates to power transistors designed to operate in the ultra-high and microwave frequency ranges.

The development of the "Overlay" transistor has been recognized as an important advance in the power and frequency capabilities of RF transistors; this device is disclosed in U.S. Pat. No. 3,434,019 to Carley. In an "Overlay" transistor, the emitter consists of a plurality of discrete emitter segments extending into the base region from the top surface of the device. Base current is evenly distributed around the emitter segments by a diffused, highly conductive grid within the base region which surrounds each of the segments.

It was early suggested that the diffused, highly conductive grid in the base region of an "Overlay" device could be replaced by a conductive metal grid on the surface of the base region. But the metals heretofore used for this purpose have several disadvantages, the most serious of which results from their low temperature properties. Because these metals melt at temperatures substantially below the temperature at which the emitter segments are diffused into the base region, conductive grids made from such metals have been deposited only after emitter diffusion. As a result, the emitter contact apertures cannot be opened until after the grid is deposited. Since UHF and microwave transistors employ very narrow emitter segments on the order of 1.0 microns in width, this limitation greatly increases the likeihood that one of the emitter-base junctions will be exposed and shorted when the emitter contact apertures are subsequently opened.

THE DRAWINGS

Figure 1:
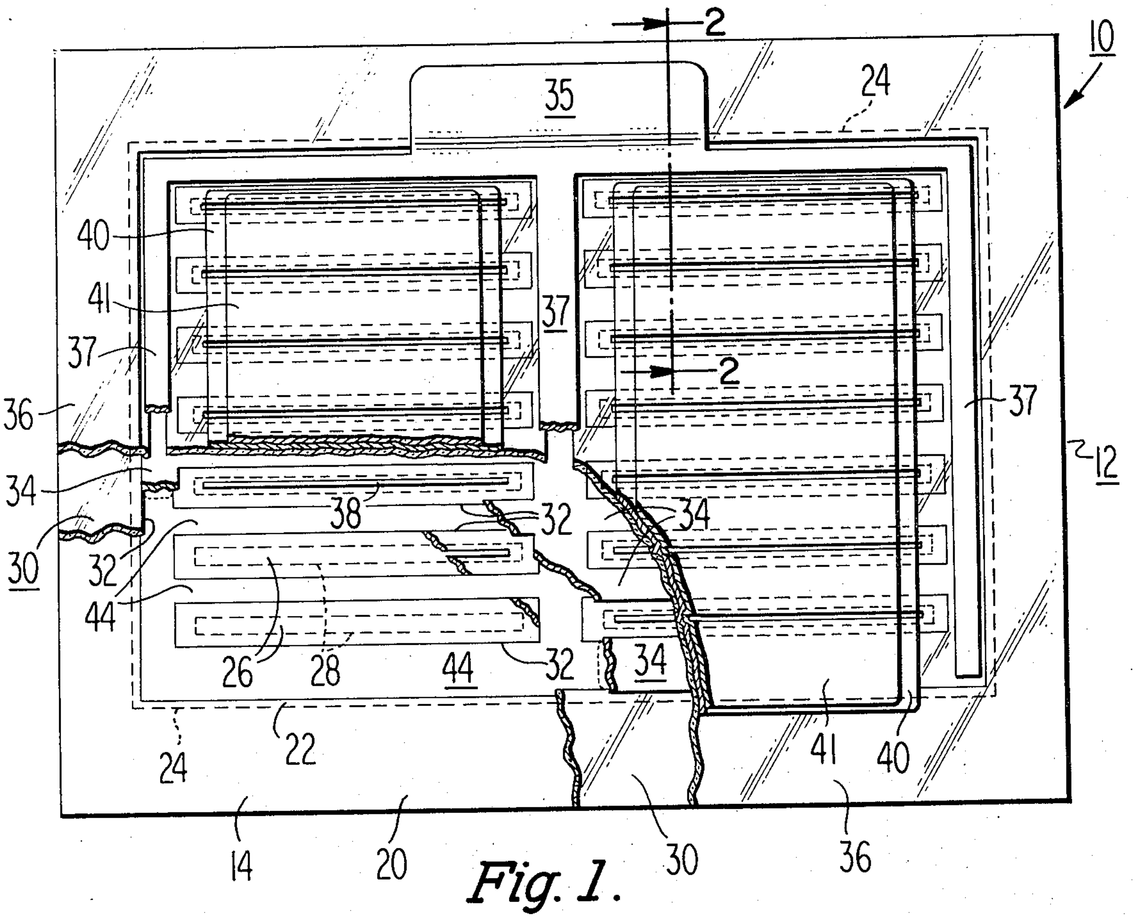
FIG. 1 is a top plan view of a portion of a transistor made in accordance with the present process.
Figure 2:
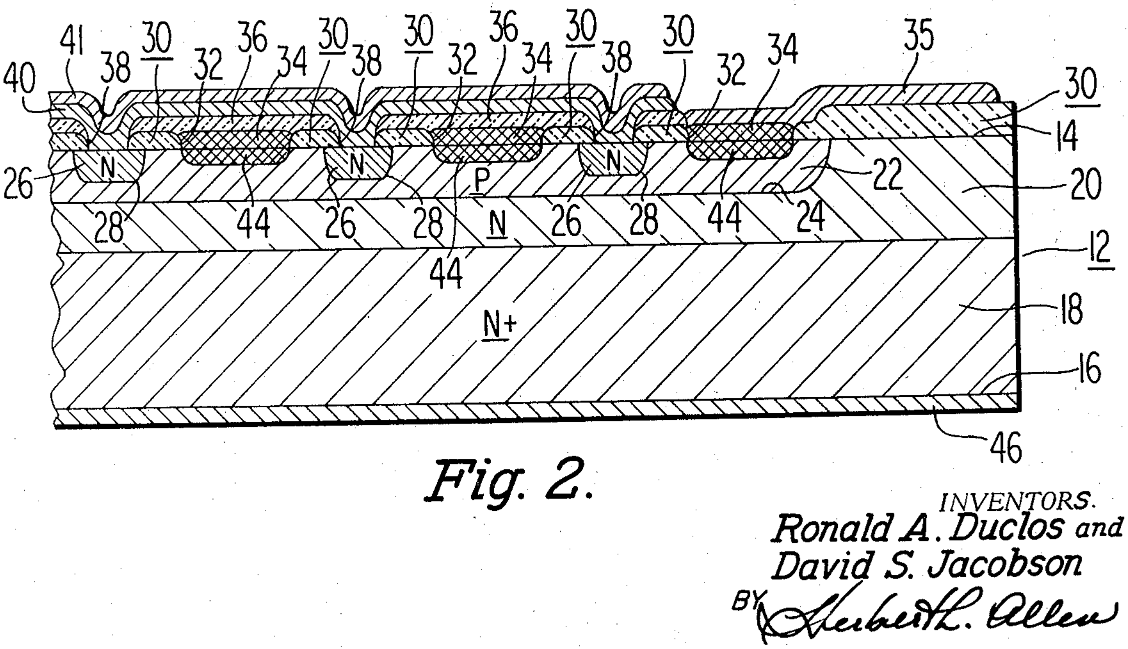
FIG. 2 is a magnified cross-sectional view of a portion of the transistor in FIG. 1, taken along the line 2—2.
Figure 3A:
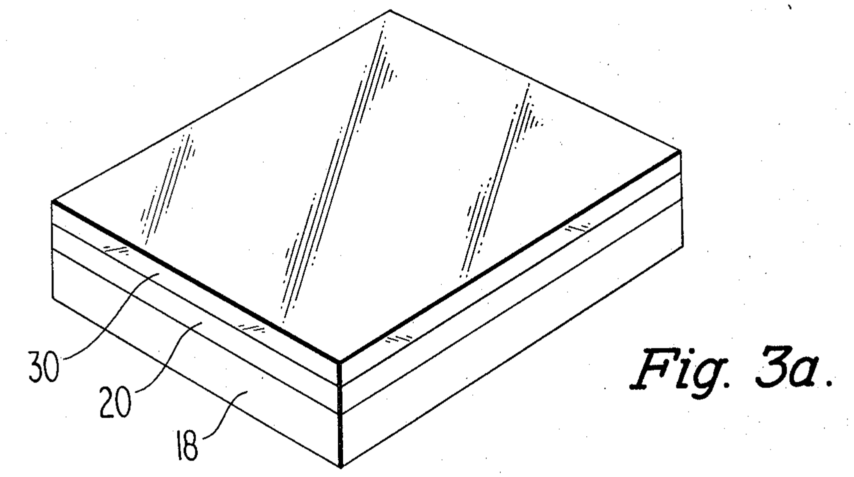
Figure 3B:
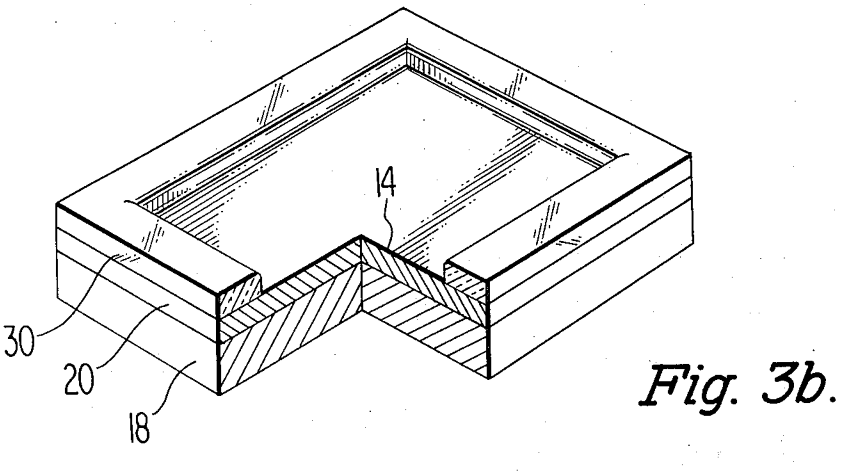
Figure 3C:
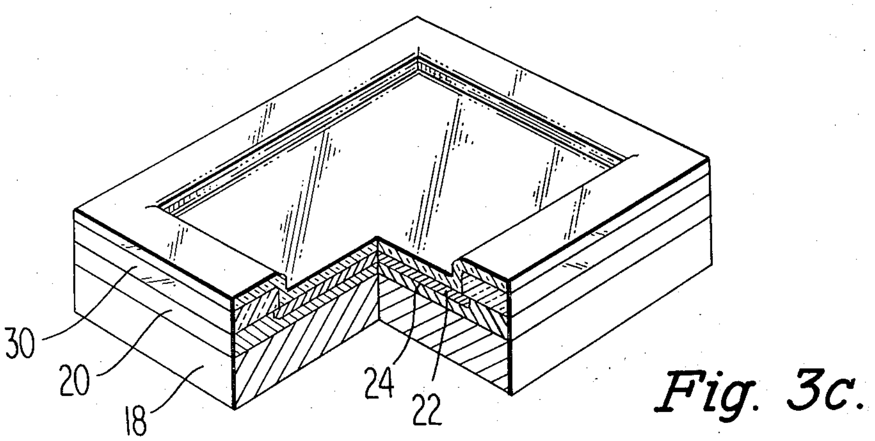
Figure 3D:
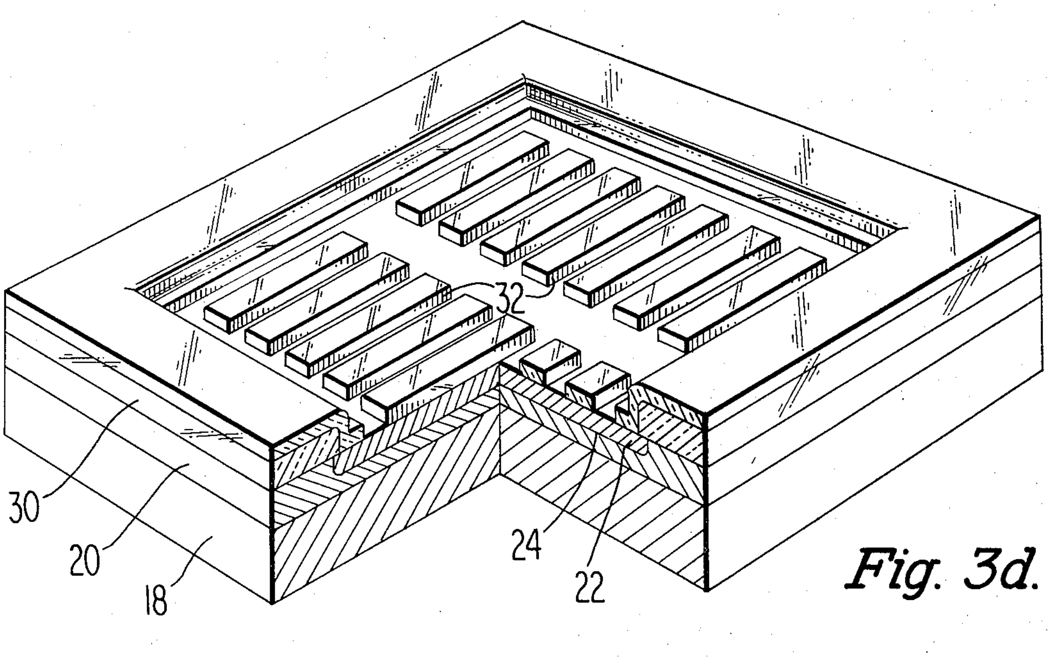
Figure 3E:
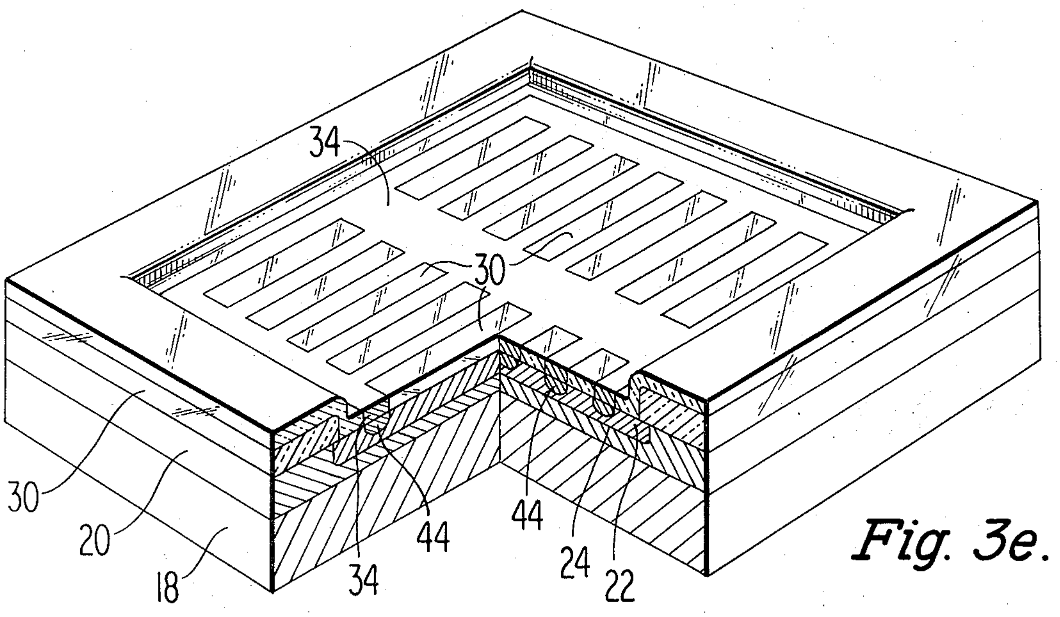
Figure 3F:
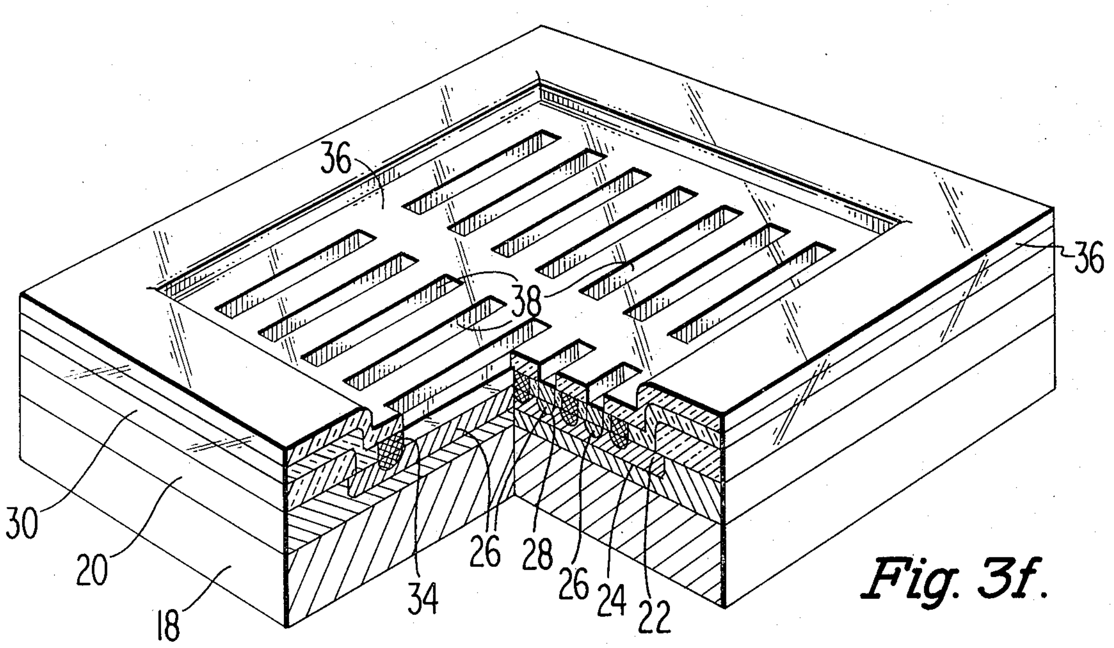

FIGS. 3*a–f* are perspective views of representative steps in the fabrication of the transistor of FIGS. 1 and 2.

Figure 4:
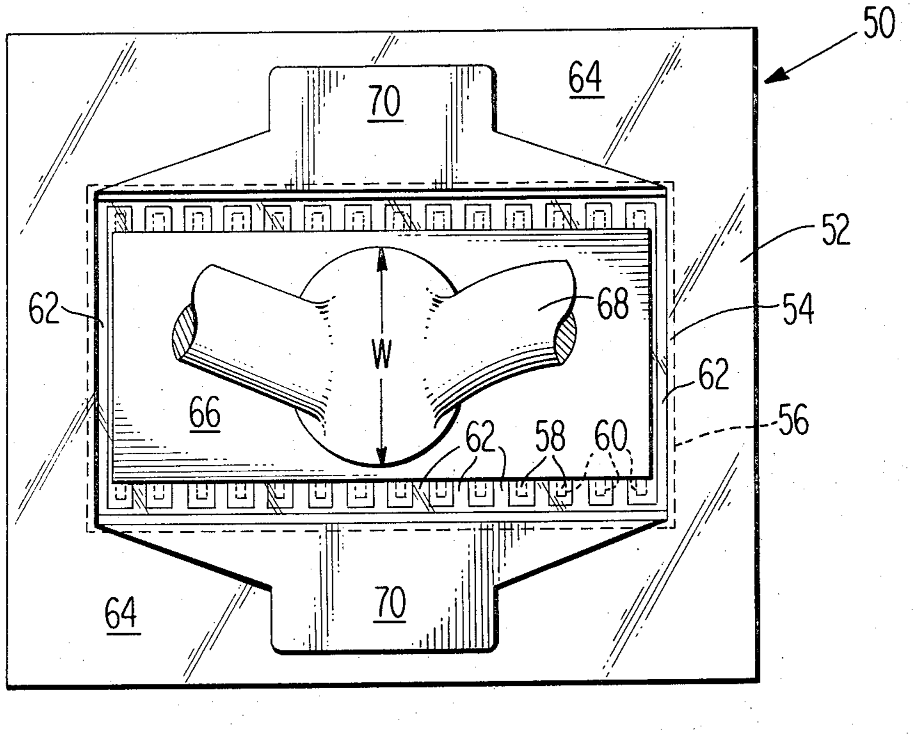

FIG. 4 is a top plan view of an alternative embodiment of a transistor made in accordance with the present process.

DETAILED DESCRIPTION

An RF transistor adapted to be made by the present process will be described with reference to FIGS. 1 and 2.

The transistor, referred to generally as 10, is formed in a semiconductor body 12 having upper and lower opposed surfaces 14 and 16, respectively. The dimensions and composition of the body 12 are not critical. By way of example, the body 12 may comprise a silicon die which is 60.0 mils long, 30.0 mils wide, and between 4.0 and 8.0 mils thick. The transistor 10 may comprise an NPN or PNP device; however, an NPN device is described below and illustrated in FIGS. 1 and 2.

The transistor 10 includes a first conductivity type collector region (N type, in this example) within the semiconductor body 12. Preferably, the collector region includes a highly conductive (N+) substrate 18 and a less conductive (N) region 20 adjacent the substrate 18.

The transistor also includes a second conductivity type (P type) base region 22 which extends into the collector region 20 from the upper surface 14 and is separated therefrom by a base-collector PN junction 24 (shown by dotted line in FIG. 1). A plurality of discrete first conductivity type (N type) emitter segments 26 extend into the base region 22 from the upper surface 14, with an emitter-base PN junction between each emitter segment 26 and the base region 22 (also shown by dotted lines). The shape and dimensions of each emitter segment 26 may vary. However, as is known, the frequency and power handling capabilities of RF transistors depends, to a significant degree, on the optimization of the ratio of the total periphery of all of the emitter segments 26 to the area of the base region 22. Thus, it is preferable to employ emitter segments, as shown in FIG. 1, which are relatively long and thin. By way of example, each emitter segment 26 may be 75.0 microns long and 1.0 micron wide; thinner emitter segments are desirable, but are not presently achievable with state-of-the-art photolithographic techniques.

The transistor 10 further includes a first insulating coating 30, e.g. silicon dioxide, on the top surface 14. The coating 30 has a communicating slot 32 which surrounds each of the emitter segments 26 and exposes a portion of the base region 22 at the upper surface 14. A conductive layer comprising a high temperature intermetallic compound of the semiconductor is disposed only in the slot 32 to contact the base region 22 and form a conductive grid 34 which surrounds each of the emitter segments 26. An integral portion 44 of the grid 34 extends below the upper surface 14 into the base region 22. Base contact fingers 37 (FIG. 1) are disposed on top of a portion of the grid 34, and are interspersed between emitter contact fingers 40, 41, which are shown in FIG. 1, and described below. A base bond pad interconnects all of the base contact fingers 37 and is disposed on that portion of the insulating coating 30 above the collector region 20.

With reference to the grid 34, the term "high temperature intermetallic compound of the semiconductor" is intended to mean an intermetallic compound of the semi-conductor which has a melting temperature above the processing temperatures used subsequent to deposition of the grid. Generally, these temperatures do not exceed 965° C. Preferably, the semiconductor body 12 comprises silicon, and the high-temperature intermetallic compound of silicon is selected from the group consisting of platinum silicide or rhodium silicide, which compounds have melting temperatures of about 980° C and 1,400° C, respectively. A platinum silicide grid 34 is preferred. The dimensions of the grid 34 are not critical; for example, the grid may be about 1.0 to 5.0 microns wide, 0.1 to 1.0 microns thick, and may be uniformly spaced between about 1.0 to 5.0 microns from each emitter segment 26.

A second insulating coating 36 is disposed over the conductive grid 34 to provide crossover isolation for the emitter contact fingers, described below. The first and second insulating coatings 30 and 36 have emitter contact apertures 38 therein. Each of the emitter contact apertures 38 exposes a portion of one of the emitter segments 26 at the upper surface 14, and emitter contact fingers are disposed over the second insulating coating 36 and into the emitter contact openings 38. The emitter contact fingers include a polycrystalline semiconductor layer 40, e.g. silicon, and a metal layer 41 on the polycrystalline layer 40. The emitter contact further includes an emitter bond pad (not shown) which is disposed on that portion of the insulating coatings 30 and 36 over the collector region 20, and interconnects all of the metal emitter contact fingers 41. The transistor is completed with a collector contact 46 disposed on the lower surface 14.

One embodiment of the present process for making the transistor 10 will be described with reference to FIGS. *3a–f.* The starting material in this example is a relatively large silicon wafer from which many devices are made. For purposes of this description, however, the fabrication of a single transistor is described; therefore, only a portion of the wafer is shown in FIGS. *3a–f.* The original wafer is highly conductive (N+) material and will serve as the collector substrate 18 for the transistor 10. An epitaxial layer of silicon is first deposited on the substrate 18 by known techniques; this layer forms the collector region 20.

After the epitaxial deposition step, a silicon dioxide insulating coating 30 is deposited on the upper surface 14 of the collector region 20, as for example, by the thermal oxidation of the epitaxial silicon layer. As shown in FIG. *3b,* the coating 30 is treated with a suitable masking and photoresist-etch sequence to remove the coating 30 over that portion of the upper surface 14 which is to become the base region 22. The wafer is then placed in a diffusion furnace and heat-treated with a P type inpurity source, such as boron nitride, to diffuse boron into the collector region 20 to form the base region 22. Note FIG. *3c.*

After the base region diffusion step, a thin coating of boron glass may be left deposited on the remaining portions of the original silicon dioxide coating 30 and that area of the top surface 14 where the base region 22 has been diffused into the collector region 20. For further processing, this glass coating is treated as a portion of the insulating coating 30. Noting FIG. 3d, in this embodiment the insulating coating 30 is next treated with a standard photoresist-etch sequence to open the base slot 32 and expose the base region 22 at the top surface 14 at what is to become the contact area for the conductive grid 34.

Thereafter, a layer of an intermetallic compound of silicon, such as platinum silicide, is formed in the base slot 32 in the following manner. A layer of platinum, between 1,000 to 2,000 A thick, is deposited, as by sputtering, onto the insulating coating 30 and in the slot 32. This platinum layer is sintered by heating the body 12 to a temperature between 400° to 900° C in an inert atmosphere (e.g., argon). During the heating step, a platinum silicide compound is formed only in the slot 32 and extends to a shallow depth into the base region 22 (indicated by that portion 44 of the grid 34 below the upper surface in FIG. *3e*). The remaining platinum is then removed from the coating 30 by treating with a selective etch, such as an aqua regia solution, leaving the platinum silicide grid 34 only in the slot 32 (FIG. *3e*).

As shown in FIG. *3f,* a second insulating coating 36 of silicon dioxide is deposited over the insulating coating 30 and the conductive grid 34, by known techniques. The diffusion of all of the emitter segments 26 is then accomplished in the present embodiment by applying a photo-resist material over the second insulating coating 36, masking the wafer with a pattern containing the emitter contact apertures 38, exposing the photoresist, and then treating the wafer with an etch so as to remove that portion of the first and second insulating coatings 30 and 36 in the emitter contact apertures 38. The wafer is again placed into a diffusion furnace and heat-treated with an N type impurity source, such as phosphorous oxychloride, to diffuse phosphorous through each emitter contact aperture 38 and into the base region 22 (FIG. 3f) to form the emitter segments 26. The N type impurities may be driven in by heating the wafer to a temperature of about 965° C for a time sufficient to establish the emitter-base PN junctions at a desired location. After diffusion of the emitter segments 26, a thin coating of phosphorous glass is left deposited in each emitter contact aperture 38 and on the unexposed portions of the insulating coatings 36. This phosphorous glass coating is removed by briefly submerging the wafer in a dilute nitric-hydrofluoric acid etch.

Because of the extremely fine geometry and close tolerances found in these RF transistor structures, care must be taken not to heat the wafer too long during high temperature steps, including emitter formation step, after the formation of the base grid 34. Emitter-base and base-collector shorts may result, thus reducing manufacturing yields. These shorts may be due to crystallographic reorientation of the platinum silicide of the base grid 34, resulting in spikes through the base into the emitter and collector regions. A modification of the present method reduces the total processing time at high temperature subsequent to the formation of the base grid 34. This modification involves partially diffusing the emitter segments 26 prior to the formation of the base grid 34. This may be done by known photolithographic procedures immediately after the base diffusion step illustrated in FIG. 3c. For example, the boron glass coating formed during the base diffusion is removed and a new masking oxide (not shown) is then grown or deposited. Apertures for the emitter sites are then opened in the masking oxide and a partial diffusion of the emitter segment is performed to produce emitter PN junctions which are spaced from the collector PN junction by a distance greater than the spacing desired in the finished device. In other words, the duration of this step is a time less than the total time required to introduce the emitter segments to the desired depth beneath the surface 14. The duration of the heating of the wafer to the emitter diffusion temperature of about 965° C subsequently to the formation of the base grid forming step may thus be shortened.

The amount of pre-diffusion of the emitter segments 26 which should be done is a variable function of the dimensions of the segments, the geometry of the base grid, etc., and may be determined by routine experimentation for any given device. As one example, given here for illustrative purposes only, a device having the dimensions set forth above was made by a process having an emitter diffusion schedule of about 11 minutes at 965° C with about 7 minutes done prior to base grid formation and the balance done after. Satisfactory yields were achieved by this process, whereas unsatisfactory yields resulted when the entire diffusion was done after base grid formation. Of course, if the prediffusion embodiment of the present process is used, it will be necessary to form a new masking coating for the base grid formation, and this may be done in conventional manner.

Regardless of whether the emitter segments 26 are formed partially or completely after the base grid forming step, the next step in the present process is the formation of an emitter contact. Preferably, the emitter contact comprises the multi-layered system which is described above, and shown in FIG. 2. Therefore, a polycrystalline silicon layer is next deposited over the second insulating coating 36 and in the emitter contact apertures 38. This silicon layer is then treated with a photoresist-etch sequence to define the emitter polycrystalline silicon fingers 40. Thereafter, openings for the base fingers 37 are made in the second insulating coating 36 by still another photoresist-etch sequence. The unexposed photoresist is removed, and a metal layer, such as aluminum or tungsten, is deposited through the base contact openings, over the polycrystalline silicon layer, and over the remaining portions of the second insulating coating 36. This metal layer is then treated to define the emitter and base contact fingers 41 and 37, and the emitter and base contact pads, resulting in the transistor 10 shown in FIGS. 1 and 2.

An alternative embodiment of the transistor 10 is shown in FIG. 4. This embodiment is similar to the transistor 10 of FIG. 1, except that all of the emitter segments are sufficiently long to allow bonding of the emitter lead directly to the emitter contact layer. The transistor of FIG. 4, referred to generally as 50, includes a collector region 52 and a base region 54 extending into the collector region, with a base-collector PN junction 56 therebetween. A plurality of discrete, relatively long and thin emitter segments 58 extend into the base region 54, with an emitter-base PN junction 60 between each emitter segment and the base region (the base-collector junction 56 and all of the emitter-base junctions 60 are illustrated in FIG. 4 by dotted lines). In this embodiment, it is essential that each emitter segment 58 be at least as long as the width of a wire bond, which is described below. A platinum silicide grid 62 is disposed on the base region 54 and surrounds each emitter segment 58; this grid 62 also extends a short distance into the base region 54, in the same manner as the grid 34 of FIGS. 1 and 2.

An insulating coating 64 is disposed over the platinum silicide grid 62, and has emitter contact apertures (not shown) which expose each emitter segment 58 at the surface. An emitter contact layer 66 is disposed over the insulating coating 64 and into the apertures, contacting the emitter segments 58. A relatively large wire 68 is bonded to the emitter contact layer 66 directly over the emitter segments 58, and forms a bond width (designated "*w*" in FIG. 4) between 50.0 to 100.0 microns wide. Base contact layers 70 are disposed on opposite sides of the transistor 50 and contact the platinum silicide grid 62.

A transistor made by the present process offers, among others, the following advantages with respect to prior art RF devices.

First, with respect to "Overlay" devices as described above, a transistor made by the present process does not require the use of a deeply diffused conductive grid within the base region. This allows relatively thin collector regions to be employed, resulting in an increase in frequency capabilities.

Second, the grid of the transistor is more conductive than the diffused grid of an "Overlay" device. As a result, the length of the emitter segments in the transistor can be increased, for example, by a factor of two, over the length of emitter segments in an "Overlay" device. The ability to employ longer emitter segments also allows the bonding of the emitter leads directly over the emitter segments (as shown in FIG. 4), thus reducing the parasitic emitter-to-collector capacitance with respect to devices using emitter bond pads disposed over the collector oxide. Alternatively, the emitter length may be unchanged with improved injection uniformity down the length of the emitter, as a result of the higher conductivity of the metal grid.

Third, the conductive grid in an "Overlay" device diffuses laterally, thus creating a limitation on the spacing between adjacent emitter segments. The conductive grid of the transistor of the present invention, on the other hand, avoids this limitation and permits a close spacing between emitter segments, resulting in a high emitter periphery-to-base area ratio; for example, ratios of 8.0 can be achieved.

Fourth, the conductive grid of the transistor 10 is capable of withstanding high processing temperatures subsequent to deposition of the grid, allowing the grid to be formed prior to emitter diffusion. Fifth, the intermetallic grid may be formed selectively only in the grid slot, thus reducing the number of processing steps required as compared to other metals which would have to be photo-lithographically defined to form the grid.

What is claimed is:

1. A method for making a semiconductor device, comprising the steps of:

providing a semiconductor body having first and second regions therein of opposite type conductivity, said first region being at a surface of said body, and said second region being contiguous with said first region and forming a PN junction therewith;

forming a conductive grid having high temperature properties on said surface in contact with a first portion of said first region, said conductive grid being capable of withstanding the temperature of a subsequent diffusion step;

subsequently diffusing a third region of a conductivity opposite that of said first region through said surface and into a second portion of said first region in spaced relationship with said grid;

coating said conductive grid with a layer of insulating material; and providing an electrically conductive layer on said insulating layer and in contact with said third region at said surface.

2. A method according to claim 9 wherein said third region in said second portion of said first region is partially diffused prior to said conductive grid forming step.

3. A method according to claim 1 wherein said semiconductor body and said regions consist essentially of silicon, and wherein said conductive layer comprises a high temperature intermetallic compound of silicon.

4. A method according to claim 3 wherein said high temperature intermetallic compound of silicon consists essentially of platinum silicide.

5. A method according to claim 4 wherein said third region in said second portion of said first region is partially diffused prior to said conductive grid forming step.

6. A method of making a semiconductor device comprising the steps of:

providing a semiconductor body having first and second regions therein of opposite type conductivity, said first region being at a surface of said body, and said second region being contiguous with said first region and forming a PN junction therewith;

diffusing into one portion of said first region through said surface a third region of opposite conductivity type to form a second PN junction spaced from said first PN junction, the duration of this diffusion step at a predetermined temperature being less than the total time required to establish between said PN junctions the spacing desired in the finished device;

forming a conductive grid having high temperature properties on another portion of said first region in surrounding relation with said third region;

subsequently heating said body to diffuse said third region for the remainder of said total time;

coating said conductive grid with a layer of insulating material; and providing an electrically conductive layer on said insulating layer and in contact with said third region at said surface.

7. A method for making a radio frequency transistor comprising the steps of:

providing a collector body of a first conductivity type having a surface;

diffusing a base region of a second conductivity type into said collector body from said surface;

providing an insulating coating on said surface;

treating said insulating coating so as to provide a communicating slot therein which exposes a portion of said base region at said surface;

depositing a layer of platinum on said insulating coating and through said slot;

treating said platinum layer to form a platinum silicide grid only in said slot;

removing the remaining platinum;

depositing another insulating coating over said one insulating coating and said platinum silicide grid;

forming apertures through said insulating coatings which expose surface portions of said base region intermediate to said grid;

subsequently diffusing an emitter region of a first conductivity type into said base region through each aperture; and depositing an electrically conductive layer on said another insulating coating and on said exposed surface portions in direct contact with each of said emitter regions.

8. A method for making a radio frequency transistor comprising the steps of:

providing a collector body of first conductivity type having a surface;

diffusing a base region of second conductivity type into said collector body from said surface;

diffusing, into a plurality of portions of said base region, a plurality of emitter segments of first conductivity type, the duration of this diffusion step at a predetermined temperature being less than the total time required to introduce said emitter segments to a desired depth beneath said surface;

providing an insulating coating on said surface;

treating said insulating coating so as to provide a communicating slot therein which exposes a portion of said base region at said surface in surrounding relation to each of said emitter segments;

depositing a layer of platinum on said insulating coating and through said slot;

treating said platinum layer to cause the formation of a platinum silicide grid only in said slot;

removing the remaining platinum;

depositing another insulating coating over said one insulating coating and said platinum silicide grid;

forming apertures through said insulating coatings which expose said emitter segments;

diffusing said emitter regions for the remainder of said total time; and depositing a layer of an electrically conductive metal on said another insulating coating and within said apertures in direct contact with said emitter regions.

* * * * *